United States Patent
Reiner

(10) Patent No.: US 9,331,193 B2
(45) Date of Patent: May 3, 2016

(54) CIRCUIT ARRANGEMENT

(71) Applicant: Fraunhofer-Gesellschaft zur Forderung der angewandten Forschung E.V., Munich (DE)

(72) Inventor: Richard Reiner, Freiburg (DE)

(73) Assignee: Fraunhofer-Gesellschaft zur Förderung der angewandten Forschung E.V., München (DE)

( * ) Notice: Subject to any disclaimer, the term of this patent is extended or adjusted under 35 U.S.C. 154(b) by 0 days.

(21) Appl. No.: 14/636,531

(22) Filed: Mar. 3, 2015

(65) Prior Publication Data

US 2015/0249151 A1 Sep. 3, 2015

(30) Foreign Application Priority Data

Mar. 3, 2014 (DE) .................. 10 2014 203 851

(51) Int. Cl.
*H01L 29/778* (2006.01)
*H01L 23/31* (2006.01)
*H01L 29/40* (2006.01)
*H01L 29/20* (2006.01)
*H01L 29/417* (2006.01)
*H01L 29/423* (2006.01)
*H01L 29/872* (2006.01)

(52) U.S. Cl.
CPC ........ *H01L 29/7787* (2013.01); *H01L 23/3171* (2013.01); *H01L 29/402* (2013.01); *H01L 29/7786* (2013.01); *H01L 29/2003* (2013.01); *H01L 29/404* (2013.01); *H01L 29/41758* (2013.01); *H01L 29/42316* (2013.01); *H01L 29/872* (2013.01)

(58) Field of Classification Search
CPC .............. H01L 23/3171; H01L 29/402; H01L 29/7786; H01L 29/7787
See application file for complete search history.

(56) References Cited

U.S. PATENT DOCUMENTS

| | | | | |
|---|---|---|---|---|
| 2007/0034901 A1* | 2/2007 | Lui | ........................ | H01L 29/407 257/197 |
| 2007/0075392 A1* | 4/2007 | Pan | ........................ | H01L 29/407 257/483 |
| 2008/0029812 A1* | 2/2008 | Bhalla | .................. | H01L 29/0878 257/330 |
| 2013/0026568 A1* | 1/2013 | Bhalla | ............... | H01L 29/66712 257/337 |
| 2014/0332882 A1* | 11/2014 | Lui | ...................... | H01L 29/7839 257/334 |

OTHER PUBLICATIONS

Chao et al., High-Voltage and High-Temperature Applications of DTMOS With Reverse Schottky Barrier on Substrate Contacts, Feb. 2004, IEEE Electron Device Letters, vol. 25, No. 2, pp. 86-88.*

* cited by examiner

*Primary Examiner* — Allan R Wilson
(74) *Attorney, Agent, or Firm* — Volpe and Koenig, P.C.

(57) ABSTRACT

A circuit arrangement with at least a source contact (7), a gate contact (6), and a Schottky-Reverse contact (2), which is embodied as a Schottky-contact above a transistor channel and connected to the source contact such that in a return operation electrons can flow from a drain contact (5, 5.1, 5.2) via the Schottky-Reverse contact to the source contact. The circuit arrangement includes at least two transistor sections (A, A', B, B'), with a first of the transistor sections (A, A') including the Schottky-Reverse contact and a second of the transistor section (B, B') being embodied without the Schottky-Reverse contact. The two transistor sections (A, A', B, B') are arranged alternating and embodied such that at least in a forward operation electrons can flow in a transistor channel from a source contact (7) to the drain contact (5, 5.1, 5.2), circumventing an area of influence (12) of the Schottky-Reverse contact.

17 Claims, 6 Drawing Sheets

CIRCUIT ARRANGEMENT

INCORPORATION BY REFERENCE

The following documents are incorporated herein by reference as if fully set forth: German Patent Application No. DE 102014203851.0, filed Mar. 3, 2014

BACKGROUND

The invention relates to a circuit arrangement that includes at least a source contact, a gate contact, and a Schottky-Reverse contact, which Schottky-Reverse contact being embodied as a Schottky-contact on a barrier layer of the circuit arrangement and being connected to the source contact such that electrons can flow in a return operation via the Schottky-Reverse contact from a drain contact to the source contact.

Circuit arrangements of the type mentioned at the outset are typically used for power applications, for example for power transistors. Such a power transistor typically comprises a drain contact, a source contact, and a gate contact. The gate contact is arranged on a barrier layer. A passivation is provided between the drain contact and the source contact, which surrounds the gate contact and essentially isolates the three contacts in the blocked state. Below the barrier layer typically a two-dimensional electron gas is embodied in a transistor channel in a forward operation of the power transistor, so that the electrons can flow from the source contact to the drain contact.

In a plurality of power applications, e.g., in semi-bridge and full bridge topologies, a diode behavior is desired between the source contact and the drain contact of a power transistor in order to protect the power transistor from damages by excessive voltages, particularly in the return operation.

From prior art it is known to this regard to generate this diode behavior by a parallel switching of the power transistor with a diode, a so-called return diode.

In the known realizations of prior art with a parallel switching of a diode it is disadvantageous that both the power transistor as well as the parallel switched diode must be realized as separate components. This can be realized either in a monolithic or a hybrid form. In the monolithic realization a lot of space is required and thus a large-scale and cost-intensive component results.

Alternatively, a transistor is known from prior art, in which a Schottky-Reverse contact is arranged between the drain contact and the gate contact. This Schottky-Reverse contact replaces as an integrated return diode the parallel switching of the diode and leads in the return operation to a diode behavior of the arrangement.

SUMMARY

The present invention is therefore based on the objective of providing a circuit arrangement for power applications, which particularly in the return operation exhibits a diode behavior between the source contact and the drain contact and allows in the forward operation a current flow, which is increased in reference to prior art.

This objective is attained in a circuit arrangement having one or more features of the invention. Preferred embodiments of the circuit arrangement according to the invention are disclosed below and in the claims. Hereby, the wording of all claims is explicitly included in the description by way of reference.

The circuit arrangement according to the invention includes, as known per se, a source contact, at least one gate contact, and a Schottky-Reverse contact. The Schottky-Reverse contact is embodied as a Schottky-contact via a transistor channel of the circuit arrangement and connected to the source contact such that in a return operation here electrons can flow from a drain contact via the Schottky-Reverse contact to the source contact.

It is essential that the circuit arrangement comprises at least two transistor sections, with a first transistor section including the additional Schottky-Reverse contact and a second transistor section being embodied without the additional Schottky-Reverse contact, which two transistor sections being arranged and embodied alternating such that at least in the forward operation electrons can flow in a transistor channel from the source contact to a drain contact, circumventing an area of influence of the Schottky-Reverse contact.

Research of the applicant has shown that in transistors of prior art with integrated return diodes the current flow between the source contact and the drain contact in the forward operation is largely restricted by the Schottky-Reverse contact. Such transistors can therefore not achieve the maximal current flow desired.

The invention is based on the acknowledgement of the applicant that in power transistors the disadvantage develops of limited potentials for current flow, based on the integrated return diode embodied via a Schottky-Reverse contact. This limitation can be overcome with the alternating arrangement of transistor sections with and without Schottky-Reverse contacts.

The circuit arrangement according to the invention differs therefore from circuit arrangements of prior art in essential aspects: The circuit arrangement according to the invention comprises at least two different transistor sections. A first transistor section comprises the Schottky-Reverse contact, while a second transistor section is embodied without the additional Schottky-Reverse contact. In the area influenced by the Schottky-Reverse contact in the transistor channel of a first transistor section the current flow is limited to the extent that maximally the ground voltage is applied at the Schottky-Reverse contact via the conductive connection to the source contact. By the alternating arrangement of the two transistor sections the electrons can flow in the forward operation in any case in the transistor channel, circumventing the area influenced by the Schottky-Reverse contact, i.e. in the second transistor section without the additional Schottky-Reverse contact between the source contact and the drain contact.

This leads to the advantage that in the forward operation, i.e. when the gate contact allows current flow, the current flow can occur not only via the area influenced by the Schottky-Reverse contact but also sections are provided in the transistor channel, which are not influenced by the Schottky-Reverse contact so that the current flow can occur in the second transistor section. The current flow from the drain contact to the source contact is therefore not significantly restricted by the Schottky-Reverse contact in the first transistor section with regards to the circuit arrangement overall, while the advantageous diode behavior of the Schottky-Reverse contact is given, particularly in the return operation.

Within the scope of this description, the current flow is shown with the physical direction of current flow. The electrons therefore flow in the forward operation (circulatory flow operation) of the transistor, i.e. when the voltage of the gate source is greater than the threshold voltage of the transistor, from the source contact to the drain contact. In the return operation the electrons, regardless of any gate voltage, can flow in the transistor channel from the drain contact via the Schottky-Reverse contact and thus towards the source contact.

Within the scope of this description, the Schottky-Reverse contact comprises a metal contact on the barrier layer as well as the barrier layer itself. Preferably, the Schottky-Reverse contact is embodied as a nickel contact; however it may also be embodied from other metals.

The area of influence of the Schottky-Reverse contact defines the area, in which the Schottky-Reverse contact essentially influences the behavior of the electrons. The area of influence of the Schottky-Reverse contact typically ranges to the inside of the transistor channel, i.e. to the two-dimensional electron gas located right underneath the barrier layer in the buffer layer. The influence of the Schottky-Reverse contact upon the area of influence of the Schottky-Reverse contact may represent depleting, enriching, or also choking off the electrons in the transistor channel.

Preferably the Schottky-Reverse contact is arranged as close as possible near the gate contact. This leads to the advantage that the drift zone of the electrons of the transistor channel remains as small as possible. Here, the gate contact may exhibit a normally-on or normally-off behavior. Additionally, the gate contact may be embodied as a Schottky-Gate or isolated in reference to the transistor channel.

In a preferred embodiment, at least two transistor sections are arranged alternating and perpendicular in reference to a connecting line from the drain contact to the source contact. Preferably, the alternating arrangement of at least two transistor sections perpendicular in reference to a connecting line from the drain contact to the source contact is formed by an intermittent embodiment of the Schottky-Reverse contact. The Schottky-Reverse contact is embodied intermittent such that interrupted sections are included without any Schottky-Reverse contacts, i.e. sections representing a part of the second transistor section. Intermittent sections, i.e. without Schottky-Reverse contracts and sections with Schottky-Reverse contacts, are arranged alternating such that the alternating arrangement of at least two transistor sections occurs perpendicular in reference to the connecting line from the drain contact to the source contact. Most preferably, the drain contact, source contact, and gate contact are embodied continuously for all transistor sections, i.e. the alternatingly arranged transistor sections are embodied with a common drain contact, a common gate contact, and a common source contact.

Here, it is advantageous that by the intermittent embodiment of the Schottky-Reverse contact a space-saving, alternating arrangement of at least two transistor sections can be embodied in a simple fashion. Additionally, this embodiment leads to a good thermal distribution.

In another preferred embodiment the circuit arrangement comprises a series of Schottky-Reverse contacts. The series of Schottky-Reverse contacts comprises a plurality of Schottky-Reverse contact sites, which are distanced from each other, preferably with a consistent distance. Therefore, in the series of Schottky-Reverse contacts the Schottky-Reverse contact sites as well as the intermittent sections are arranged alternating, preferably filled by passivation. This way, in a simple fashion an alternating arrangement can be achieved of at least two transistor sections, which are embodied regularly, space-saving, and well controllable in the production process or electronically.

Preferably, the Schottky-Reverse contact sites are embodied as round and/or square contacts. In a round and/or square embodiment of the Schottky-Reverse contact sites the current flows additionally also from the side facing away from the drain contact, i.e. from the side facing the gate contact, into the Schottky-Reverse contact sites. This way, the current flow can also avoid areas on which no Schottky-Reverse contact sites are arranged. Additionally, an advantageous thermal distribution of the heat sources results.

In an alternative preferred embodiment at least two transistor sections are arranged alternating in the direction of a connecting line from the drain contact to the source contact. This way the advantage develops of efficient area utilization.

Preferably, the first transistor section and the second transistor section are arranged alternating side-by-side. In the direction of a connecting line from the drain contact to the source contact, here for example starting at a first transistor section on the drain contact, the Schottky-Reverse contact, the gate contact, the source contact, and finally the second transistor section with the source contact, gate contact, and drain contact are arranged. This sequence can be continued in an alternating fashion. This results in the advantage that in a simple and space-saving fashion an alternating arrangement is embodied of the first and the second transistor section. Particularly preferred are first and second transistor sections, located side-by-side, embodied with a common source contact or with a common drain contact. This results in another space saving effect.

In a preferred embodiment the gate contact, the source contact, the drain contact, as well as the Schottky-Reverse contact or the series of Schottky-Reverse contacts are embodied linearly, preferably linearly and parallel in reference to each other. This way, in a simple fashion a circuit arrangement can be embodied with an alternating arrangement, which allows a space-saving and advantageous arrangement with regards to heat distribution.

Preferably, the circuit arrangement is arranged on a chip. Particularly preferred, the circuit arrangement is embodied with a comb-like structure. This results in the advantage that the circuit arrangement is embodied in a space-saving fashion on the chip and heat dissipation occurs as homogenously as possible, i.e. evenly over the chip. Preferably, both the gate contact, the source contact, and the drain contact are embodied with a comb-like structure, particularly preferred as comb-like structures engaging each other. This way, in a simple and space-saving fashion a transistor with high capacity can be embodied, which exhibits an alternating arrangement according to the invention of at least two transistor sections.

In a preferred embodiment the circuit arrangement comprises field plates for the distribution of field peaks. The field plates distribute fields developing and thus serve particularly for the protection of the gate contact in the blocked state. Typically, field plates are embodied as potential plates without any current flow.

In a preferred embodiment, in the first transistor section an upper field plate is connected in a conductive fashion to the source contact and the Schottky-Reverse contact and a lower field plate is arranged at the Schottky-Reverse contact and connected thereto in a conductive fashion. This way, current flow is possible via the field plates to and from the source contact. By the use of the field plates, in a simple fashion a conductive connection can be generated between the Schottky-Reverse contact and the source contact such that in a return operation the electrons can flow from the drain contact via the Schottky-Reverse contact to the source contact.

Preferably the lower field plate overlaps the Schottky-Reverse contacts parallel in reference to the connecting line between the drain contact and the source contact, particularly preferred the upper field plate overlaps the Schottky-Reverse contacts and the lower field plate parallel in reference to the connecting line between the drain contact and the source contact. This way the field peaks of the fields ending at the Schottky-Reverse contacts are distributed and potentially disruptive field peaks in the circuit arrangement are reduced.

In a preferred embodiment the circuit arrangement is embodied as a GaN-based circuit arrangement. Due to the high band distance, GaN is particularly suited as the semiconductor material for power applications. Alternatively, the circuit arrangement can also be embodied as a GaAs-circuit arrangement. Particularly preferred, the circuit arrangement is embodied as a hetero-junction field effect transistor. This way, in a simple fashion a GaN-based hetero-junction field effect transistor can be embodied as a power component with a diode behavior between the source contact and the drain contact.

In a preferred embodiment the circuit arrangement comprises a passivation, which passivation is embodied at least above the barrier layer between the source contact and the drain contact as well as between the upper field plate and the gate contact. Here it is advantageous that the passivation isolates the surface of the transistor and prevents undefined surface conditions, particularly of the barrier layer.

Preferably the barrier layer is embodied as a doped layer, particularly preferred as an aluminum-doped GaN-layer. The barrier layer is preferably arranged directly on the buffer layer; most preferred the buffer layer is embodied as an undoped GaN-layer.

The circuit arrangement according to the invention is generally suitable for semiconductor components in power electronics. The circuit arrangement according to the invention is therefore preferably embodied as a GaN-based hetero-junction field effect transistor.

BRIEF DESCRIPTION OF THE DRAWINGS

In the following, additional preferred features and embodiments of the circuit arrangement according to the invention are explained based on exemplary embodiments and the figures. Shown are.

DETAILED DESCRIPTION OF THE PREFERRED EMBODIMENTS

Figure 1:
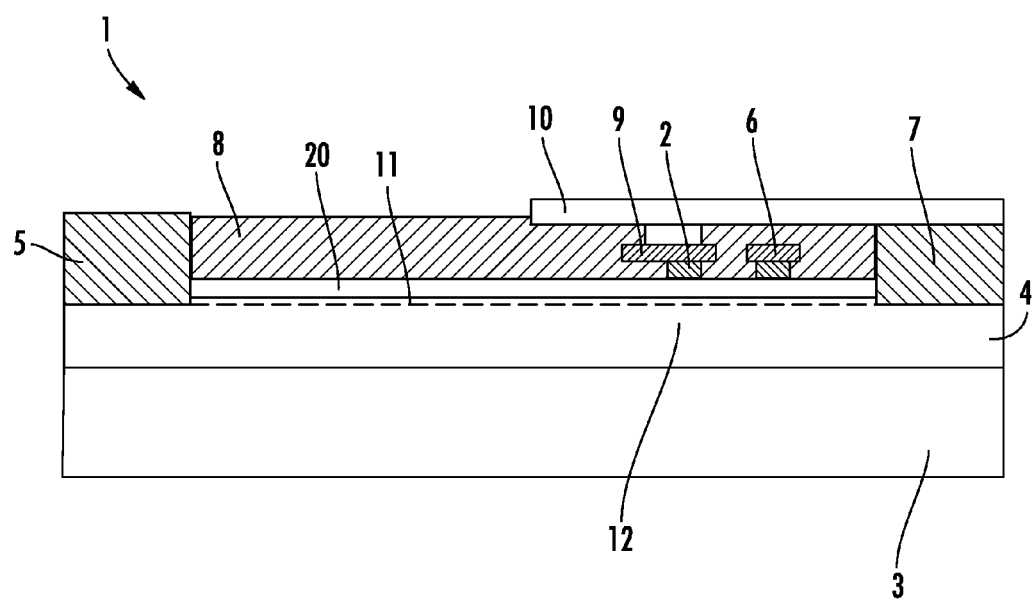
FIG. 1 a schematic illustration of a known circuit arrangement with an integrated return diode according to prior art in a cross-section.
Figure 6A:
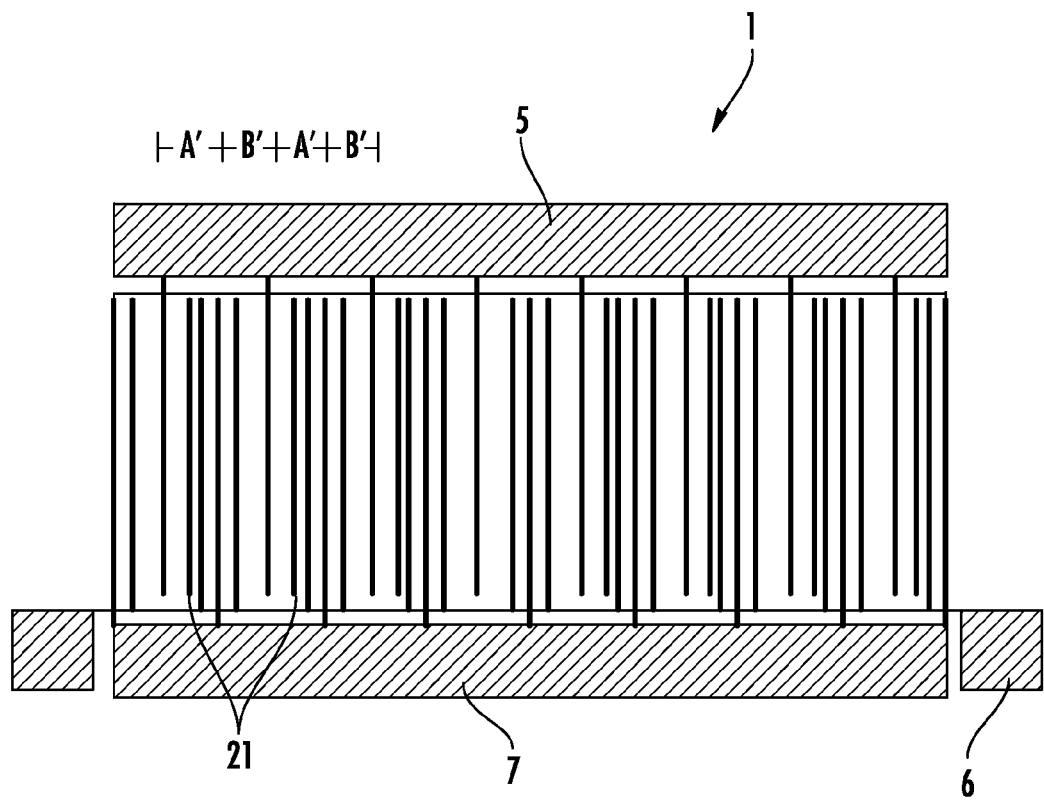
FIGS. 6a and 6b schematic illustrations of a circuit arrangement according to the invention in a top view; with FIG. 6a being a detail of the exemplary embodiment according to FIG. 4 and FIG. 6b being of the exemplary embodiment according to FIG. 5.
Figure 6B:
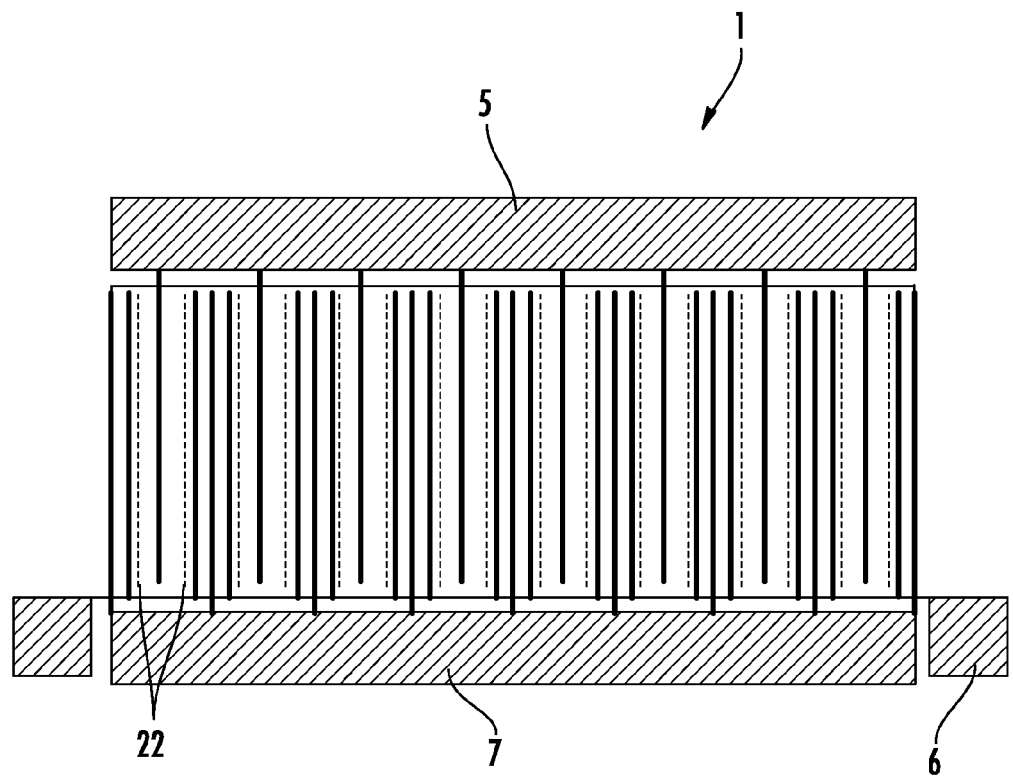

In FIGS. 1, 6a, and 6b identical reference character mark identical elements or those causing the same effects.

FIG. 1 shows a schematic illustration of a known transistor 1 with an integrated return diode according to prior art.

The transistor 1 comprises a substrate 3 as well as a buffer layer 4. A drain contact 5, a gate contact 6, and a source contact 7 are arranged on the buffer layer. The passivation 8 is arranged between the drain contact 5 and the source contact 7, which passivation also includes the gate contact 6. A Schottky-Reverse contact 2 is arranged between the drain contact 5 and the gate contact 6. This Schottky-Reverse contact 2 represents the integrated return diode. The Schottky-Reverse contact 2 is embodied on the barrier layer 20.

A lower field plate 9 is arranged on the Schottky-Reverse contact 2. The lower field plate 9 is connected in a conductive fashion via the Schottky-Reverse contact to an upper field plate 10. The upper field plate 10 is further connected in a conductive fashion to the source contact 7 and is arranged on the passivation layer 8. The gate contact 6 is surrounded by the passivation layer 8 and thus embodied in an isolated fashion both in reference to the lower field plate 9 as well as the upper field plate 10. The electron flow below the passivation in the transistor channel in the two-dimensional electron gas can be controlled by the gate contact 6, particularly between the drain contact 5 and the source contact 7.

In the return operation the electrons flow in the two-dimensional electron gas 11 from the drain contact 5 via the Schottky-Reverse contact 2 to the source contact 7. The direction of current indicated here represents the physical current direction, i.e. the actual direction of flow of electrons.

Here it is disadvantageous, as already mentioned, that in a forward operation the current is inhibited by the Schottky-Reverse contact 2, i.e. by the area of influence of the Schottky-Reverse contact 2 in the transistor channel 11. The area of influence of the Schottky-Reverse contact 2 in the transistor channel 11 is essentially located below the Schottky-Reverse contact 2. Here, the current flow is restricted to the extent that maximally the ground voltage is applied at the Schottky-Reverse contact 2 by the conductive connection to the source contact 7.

Figure 2:
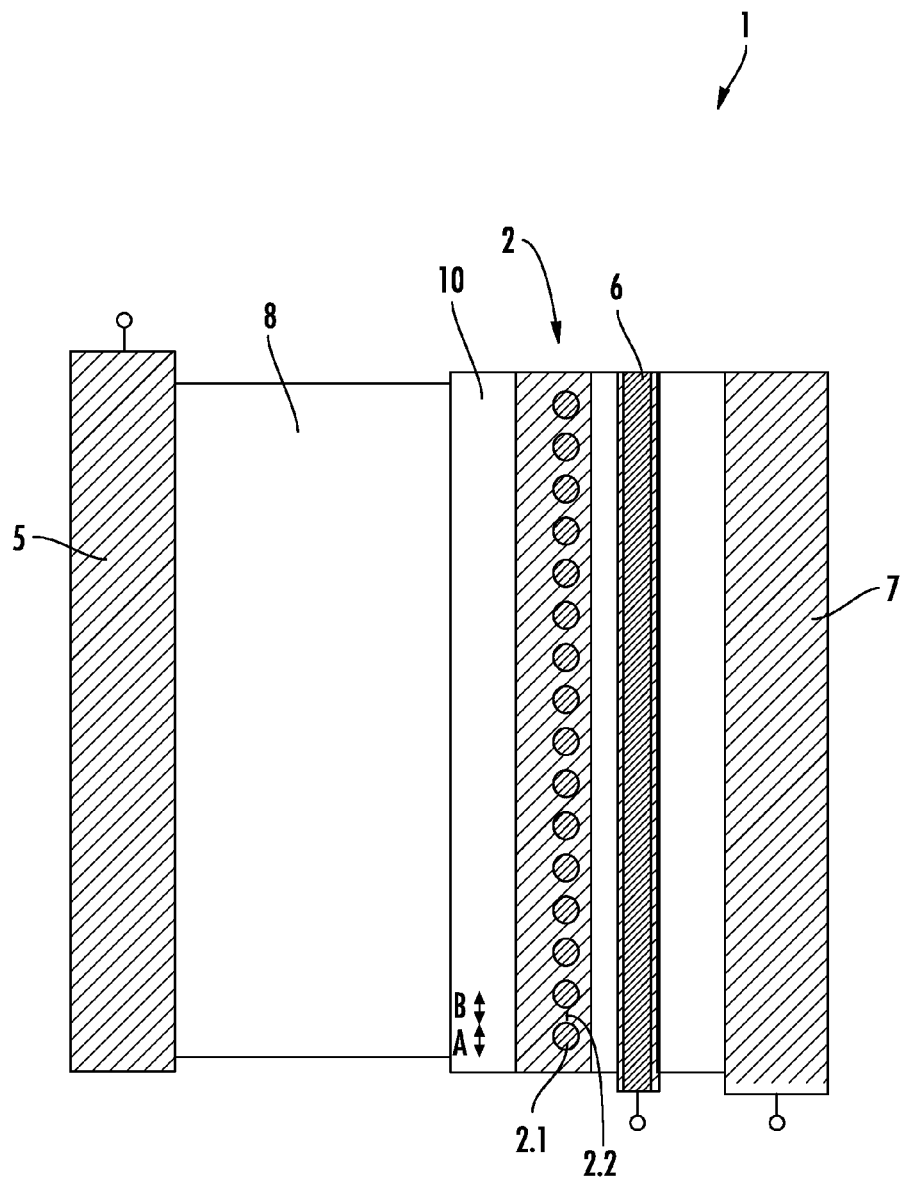
FIG. 2 a schematic illustration of a first exemplary embodiment of the circuit arrangement according to the invention in a top view.

FIG. 2 shows a first exemplary embodiment of the circuit arrangement according to the invention with an intermittent embodiment of the Schottky-Reverse contact 2. In the present case, the transistor 1 is embodied as a hetero-junction field effect transistor.

The transistor 1 comprises a drain contact 5, a gate contact 6, and a source contact 7. The Schottky-Reverse contact 2 is arranged between the drain contact 5 and the gate contact 6. An upper field plate 10 is arranged at the Schottky-Reverse contact 2. The upper field plate 10 is connected in a conductive fashion to the source contact 7 and arranged on the passivation layer 8. The gate contact 6 is surrounded by the passivation layer 8 and thus embodied isolated in reference to the upper field plate 10. The electron flow in the transistor channel in the two-dimensional electron gas 11 can be controlled via the gate contact 6, particularly between the drain contact 5 and the source contact 7. In the return operation the electrons flow in the two-dimensional electron gas 11 from the drain contact 5 via the Schottky-Reverse contact 2 to the source contact 7.

The transistor 1 comprises two transistor sections, marked A and B as examples. A first transistor section A comprises the drain contact 5, the source contact 7, the gate contact, as well as additionally the Schottky-Reverse contact, marked 2.1, 2.3 as examples. The area of influence of the Schottky-Reverse contacts 2.1, 2.3 in the transistor channel is essentially located underneath the Schottky-Reverse contacts 2.1, 2.3 in the buffer layer 4. A second transistor section B comprises an interrupter sections, marked 2.2, 2.4 as examples, and is embodied without the additional Schottky-Reverse contact. A second transistor section B comprises as a contacting here only the drain contact 5, the source contact 7, as well as the gate contact 6. The two transistor sections A and B are arranged alternating and perpendicular in reference to a connecting line from the drain contact 5 to the source contact 7. In the present case, the two transistor sections A and B are embodied with a common drain contact 5, a common source contact 7, as well as a common gate contact 6. The drain contact 5, the gate contact 6, and the source contact 7 are embodied as parallel, linear contacts.

The alternating arrangement of the transistor sections A and B is achieved in the present case such that the Schottky-Reverse contact 2 is embodied in an intermittent fashion. Here, sections comprising a Schottky-Reverse contact 2.1, 2.3 alternate with intermittent sections 2.2, 2.4 without the Schottky-Reverse contact. The Schottky-Reverse contacts 2.1, 2.3 are embodied as Schottky-Reverse contact sites 2.1, 2.3. Together with the intermittent sections 2.2, 2.4, the number of the Schottky-Reverse contact sites 2.1, 2.3 forms a series of Schottky-Reverse contacts 2 with an intermittent embodiment.

By the alternating arrangement of the two transistor sections A, B the electrons can flow in the forward operation in any case in the transistor channel, circumventing the area of influence 12 of the Schottky-Reverse contacts 2, i.e. via the sections of the transistor channel under the interrupting sections 2.2, 2.4 of the second transistor section to the source contact 7. In these sections the current flow is not limited by the influence of the Schottky-Reverse contacts 2.1, 2.3.

In the following only the differences from the above-described figures are discussed in order to avoid repetitions.

Figure 3A:
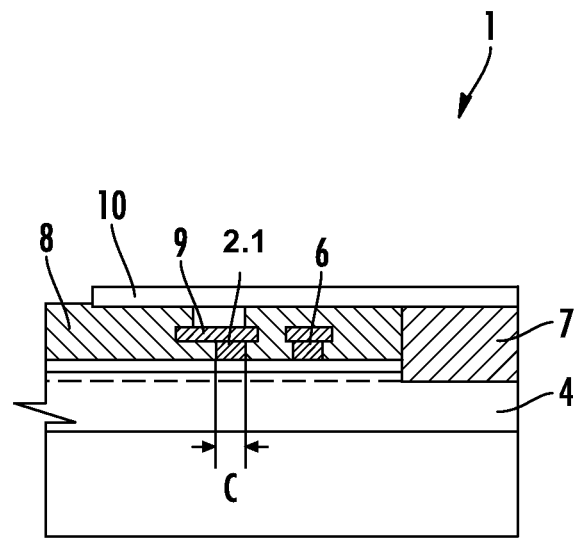
FIGS. 3a and 3b detail views of a first exemplary embodiment according to FIG. 2; with FIG. 3a being an illustration in a cross-section, and FIG. 3b being an illustration in a top view.
Figure 3B:
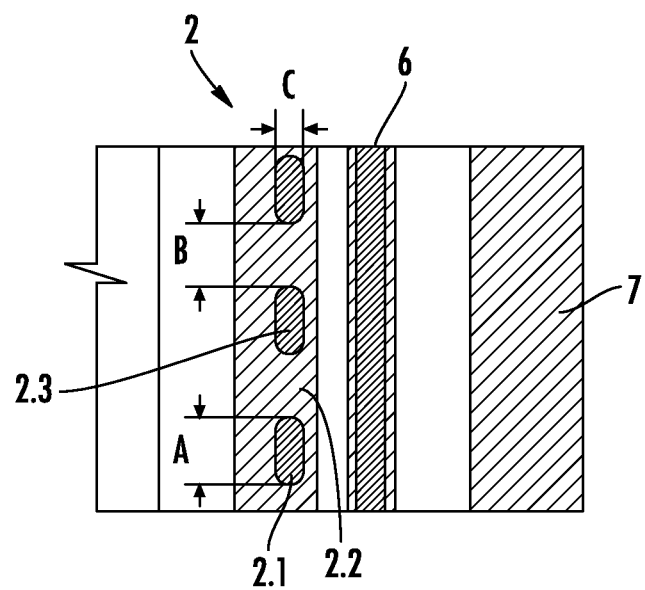

FIGS. 3a and 3b show the exemplary embodiment of FIG. 2 in an enlarged fashion, displaying a detail in a cross-section in FIG. 3a and in the illustration of FIG. 3b in a top view.

FIG. 3a shows a cross-section through the transistor 1 in a first transistor section A comprising a Schottky-Reverse contact 2.1. The Schottky-Reverse contact 2.1 is embodied as a metallic contact on the barrier layer 20, in the present case as a nickel-Schottky contact.

The lower field plate 9 is arranged at the Schottky-Reverse contact 2.1. The lower field plate 9 is connected in a conductive fashion via the Schottky-Reverse contact 2.1 to the upper field plate 10. The upper field plate 10 is further connected in a conductive fashion to the source contact 7 and is arranged on the passivation layer 8. The gate-contact 6 is surrounded by the passivation layer 8 and thus embodied in an isolated fashion in reference to both the lower field plate 9 as well as the upper field plate 10.

In the present case, the buffer layer 4 is embodied as an undoped GaN-layer. The barrier layer 20 is arranged on the buffer layer 4, in the present case embodied as an AlGaN-layer, i.e. exhibiting an aluminum doping.

FIG. 3b shows the alternating arrangement of the transistor sections A and B. The sizing of the Schottky-Reverse contact sites 2.1, 2.3 can be embodied differently, depending on application. For example, the extension of the Schottky-Reverse contact sites 2.1, 2.3 ranges in the direction of the alternating arrangement, marked by the letter A, from 0.5 µm to 2 µm, in the present case amounting to A=1 µm. Perpendicular in reference to the alternating arrangement, marked by the letter C, the extension ranges for example from 0.5 µm to 1 µm, in the present case amounting to C=0.75 µm. The Schottky-Reverse contact sites are arranged distanced, i.e. an intermittent area 2.2 is located between two Schottky-Reverse contact sites 2.1 and 2.3. The intermittent section 2.2 shows in the direction of the alternating arrangement, marked by the letter B, an extension for example from 0.5 µm to 5 µm, in the present case being B=3 µm.

Figure 4:
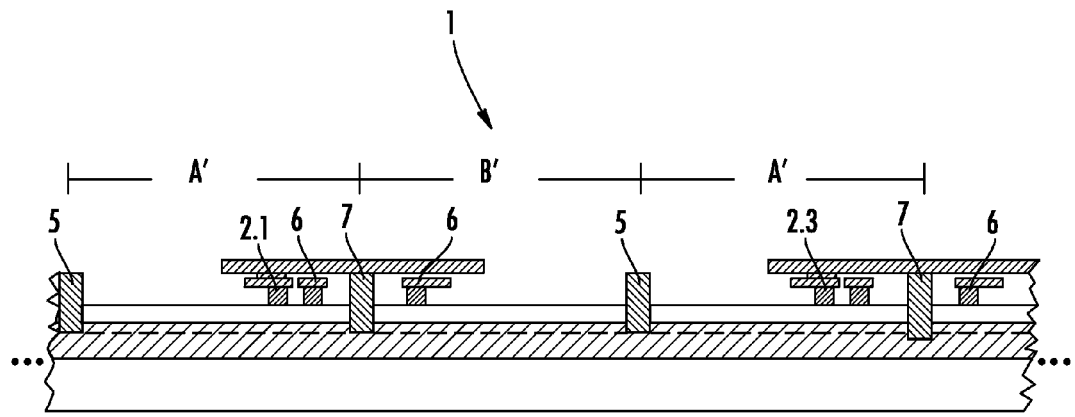
FIG. 4 a schematic illustration of a second exemplary embodiment of a circuit arrangement according to the invention in a cross-section.

FIG. 4 shows a second exemplary embodiment of the circuit arrangement according to the invention. In the present case, the transistor 1 is embodied as a hetero-junction field transistor. At least two transistor sections A' and B' are arranged alternating in the direction of a connecting line from the drain contact 5 to the source contact 7. A first transistor section A' comprises the drain contact 5, the source contact 7, the gate contact 6, as well as additionally the Schottky-Reverse contact 2.1, 2.3. A second transistor section B' comprises the source contact 7, the gate contact 6, as well as the drain contact 5, and is embodied without an additional Schottky-Reverse contact. In the return operation the electrons flow from the drain contact 5 via the Schottky-Reverse contacts 2.1, 2.3 to the source contact 7.

By the alternating arrangement of the two transistor sections A', B' the electrons can flow in the forward operation in any case in the transistor section B', and thus, circumventing the area of influence 12 of the Schottky-Reverse contacts 2, in the transistor channel in the transistor section A', to the source contact 7. No Schottky-Reverse contact 2 is present in the transistor section B' so that the current flow is not limited by the influence of the Schottky-Reverse contacts 2.1, 2.3.

In the present exemplary embodiment the transistor 1 is embodied mirror-reflected. The alternating arrangement can continue arbitrarily in both directions. Two transistor sections A' and B', arranged side-by-side, are each embodied with a common source contact 7. Additionally, two transistor sections B' and A', located side-by-side, are embodied with a common drain contact 5.

Figure 5:
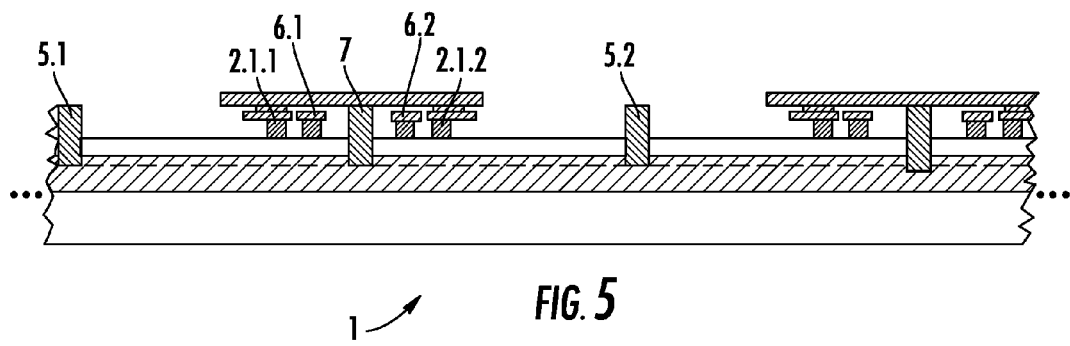
FIG. 5 a schematic illustration of a third exemplary embodiment of a circuit arrangement according to the invention in a cross-section.

FIG. 5 shows a third exemplary embodiment of a circuit arrangement according to the invention. The alternating arrangement of at least two transistor sections A and B is here embodied by an intermittent Schottky-Reverse contact 2.1.1, 2.1.2, similar to FIGS. 2 and 3. The illustration shows a cross-section through a transistor section A with a Schottky-Reverse contact.

Additionally, the circuit arrangement is embodied in a mirror-reflected fashion, in the present case along an axis of reflection, which extends along the source contact 7. The circuit arrangement is also embodied alternating, thus perpendicularly in reference to a connecting line from the drain contact 5.1 to the source contact 7, by an intermittent series of Schottky-Reverse contacts 2.1.2. A second series of Schottky-Reverse contacts 2.1.2, embodied in an intermittent fashion, is mirrored at axis of reflection, i.e. arranged mirror-symmetrical at the other side of the source contact 7. A gate contact 6.2 is arranged between the Schottky-Reverse contact 2.1.2 and the source contact 7. Another drain contact 5.2 is arranged at the side of the Schottky-Reverse contact 2.1.2 facing away from the gate contact 6.2. The circuit arrangement 1 further continues in a reflected fashion on the opposite side of the drain contact 5.2.

FIG. 6a shows the exemplary embodiment according to FIG. 4. Here, the top view is shown onto the contacting structure of a transistor 1. The contacting structure comprises a drain contacting structure 5, a source contacting structure 7, as well as a gate contacting structure 6. Additional Schottky-Reverse contact structures 21 are arranged in the first transistor sections, as an example marked A'.

The contacting structures 5, 6, 7, known per se, are embodied as mutually engaging comb-like structures. Starting at one primary contacting line, fingers branch off respectively in a perpendicular fashion. The fingers of the three contacting structures 5, 6, 7 extend distanced from each other and parallel. The Schottky-Reverse contact structures 21 extend linearly and parallel in reference to the contacting structures 5, 6, 7.

A first transistor section A' comprises the drain contact 5, the source contact 7, the gate contact 6, as well as additionally the Schottky-Reverse contact 21. A second transistor section B' comprises the source contact 7, the gate contact 6, as well as the drain contact 5, and is embodied without an additional Schottky-Reverse contact.

FIG. 6b shows the exemplary embodiment according to FIG. 5. Here, the top view is shown onto the contacting structure of the transistor 1. The contacting structure comprises a drain contacting structure 5, a source contacting structure 7, as well as a gate contacting structure 6. Additionally, series of Schottky-Reverse contacts 22 are arranged between the drain contact fingers and the gate contact fingers.

The contacting structures 5, 6, 7, as known per se, are embodied as mutually engaging comb-like structures. Starting at a primary contacting line fingers branch off, extending in a perpendicular fashion. The fingers of the three contacting structures 5, 6,7 extend distanced from each other and parallel. The series of Schottky-Reverse contacts 22 comprise a number of Schottky-Reverse contact sites. They form, together with the intermittent sections, a series of Schottky-Reverse contacts 22 formed in an intermittent embodiment.

The invention claimed is:

1. A circuit arrangement comprising:
   at least a source contact (7),
   a gate contact (6),
   a Schottky-Reverse contact (2), embodied as a Schottky-contact above a transistor channel and connected to the source contact (7) such that in a return operation electrons flow from a drain contact (5, 5.1, 5.2) via the Schottky-Reverse contact (2) to the source contact (7),
   at least first and second transistor sections (A, A', B, B'), with the first transistor section (A, A') comprising the Schottky-Reverse contact (2) and the second transistor section (B, B') embodied without the Schottky-Reverse contact, the two transistor sections (A, A', B, B') arranged alternating and embodied such that at least in a forward operation electrons can flow, in the transistor channel from the source contact (7) to the drain contact (5, 5.1, 5.2), circumventing an area of influence (12) of the Schottky-Reverse contact.

2. The circuit arrangement according to claim 1, wherein the at least first and second transistor sections (A, A', B, B') are arranged alternating and perpendicular in reference to a connecting line from the drain contact (5, 5.1, 5.2) to the source contact (7).

3. The circuit arrangement according to claim 1, wherein an alternating arrangement of at least two of the transistor sections (A, B) is embodied perpendicular in reference to a connecting line from the drain contact (5, 5.1, 5.2) to the source contact (7) by an intermittent embodiment of the Schottky-Reverse contact (2).

4. The circuit arrangement according to claim 1, further comprising a series of the Schottky-Reverse contacts (2), said series of Schottky-Reverse contacts (2) comprises a plurality of Schottky-Reverse contact sites (2.1, 2.2), which are arranged spaced apart from each other.

5. The circuit arrangement according to claim 1, wherein the at least first and second transistor sections (A', B') are arranged alternating in a direction of a connecting line from the drain contact (5, 5.1, 5.2) to the source contact (7).

6. The circuit arrangement according to claim 5, wherein the alternating arrangement of the at least first and second transistor sections (A', B') is embodied in a direction of a connecting line from the drain contract (5, 5.1, 5.2) to the source contact (7), such that the first transistor section (A') and the second transistor section (B') are arranged side-by-side.

7. The circuit arrangement according to claim 1, wherein the first transistor section (A') and the second transistor section (B') are embodied with a common source contact (7).

8. The circuit arrangement according to claim 1, wherein the gate contact (6), the source contact (7), the drain contact (5, 5.1, 5.2), and the Schottky-Reverse contact (2) are embodied linearly.

9. The circuit arrangement according to claim 1 wherein the circuit arrangement is embodied as a mirror image, with an axis of reflection that extends perpendicular in reference to a connecting line from the drain contact (5, 5.1, 5.2) to the source contact (7) or parallel in reference to the connecting line from the drain contact (5, 5.1, 5.2) to the source contact (7).

10. The circuit arrangement according to claim 1, wherein the circuit arrangement has a comb-shaped structure.

11. The circuit arrangement according to claim 1, further comprising field plates (9, 10) to distribute field peaks.

12. The circuit arrangement according to claim 11, wherein in the first transistor section an upper one of the field plates (10) is connected in a conductive fashion to the source contact (7) and the Schottky-Reverse contact (2) and a lower one of the field plates (9) is arranged and connected in a conductive fashion at the Schottky-Reverse contact (2).

13. The circuit arrangement according to claim 12, wherein at least the lower field plate overlaps the Schottky-Reverse contacts (2) parallel in reference to a connecting line between the drain contact and the source contact (7).

14. The circuit arrangement according to claim 1, wherein the circuit arrangement is a GaN-based circuit arrangement.

15. The circuit arrangement according to claim 12, further comprising a passivation (8), said passivation (8) is embodied at least above a barrier layer (20) between the source contact and the drain contact as well as between the upper field plate (10) and the gate contact (6).

16. The circuit arrangement according to claim 4, wherein the gate contact (6), the source contact (7), the drain contact (5, 5.1, 5.2), and the series of Schottky-Reverse contacts (2) are embodied linearly.

17. The circuit arrangement according to claim 13, wherein the upper field plate (10) overlaps the Schottky-Reverse contacts (2) and the lower field plate (9) parallel in reference to the connecting line between the drain contact and the source contact.

* * * * *